United States Patent
Liu

(10) Patent No.: US 9,589,986 B2
(45) Date of Patent: Mar. 7, 2017

(54) ARRAY SUBSTRATE, DISPLAY DEVICE AND METHOD FOR FABRICATING ARRAY SUBSTRATE

(71) Applicant: Shenzhen China Star Optoelectronics Technology Co., Ltd., Shenzhen, Guangdong (CN)

(72) Inventor: Huan Liu, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 0 days.

(21) Appl. No.: 14/435,512

(22) PCT Filed: Jan. 21, 2015

(86) PCT No.: PCT/CN2015/071164
§ 371 (c)(1),
(2) Date: Apr. 19, 2015

(87) PCT Pub. No.: WO2016/106891
PCT Pub. Date: Jul. 7, 2016

(65) Prior Publication Data
US 2016/0190172 A1      Jun. 30, 2016

(30) Foreign Application Priority Data
Dec. 31, 2014    (CN) .......................... 2014 1 0855413

(51) Int. Cl.
*H01L 27/12* (2006.01)
(52) U.S. Cl.
CPC ........ *H01L 27/1222* (2013.01); *H01L 27/127* (2013.01); *H01L 27/1248* (2013.01); *H01L 27/1255* (2013.01); *H01L 27/1259* (2013.01); *H01L 27/1262* (2013.01)

(58) Field of Classification Search
CPC ........ G02F 1/133355; G02G 1/133556; G02G 1/136213
See application file for complete search history.

(56) References Cited

U.S. PATENT DOCUMENTS

| | | | | |
|---|---|---|---|---|
| 7,298,430 B2 * | 11/2007 | Nishino | ............ | G02F 1/136213 349/110 |
| 7,515,230 B2 * | 4/2009 | Yang | ................ | G02F 1/133555 349/114 |
| 2002/0033918 A1 * | 3/2002 | Shigeno | ............ | G02F 1/133555 349/114 |

\* cited by examiner

*Primary Examiner* — Jerome Jackson, Jr.
*Assistant Examiner* — Fang-Xing Jiang
(74) *Attorney, Agent, or Firm* — Andrew C. Cheng

(57) ABSTRACT

The invention provides an array substrate, a method therefor and a display device. The array substrate includes: a substrate, and a thin film transistor (TFT) and a pull-down capacitor disposed on the substrate. The TFT includes: a gate, a gate insulating layer, a channel layer, a source, a drain and a passivation layer. The passivation layer is disposed with a via hole corresponding to the drain, a pixel electrode is connected to the drain through the via hole. The pull-down capacitor includes: a first conductive layer, a first spacer layer, a filling layer, a second spacer layer and a second conductive layer successively stacked on the substrate. The sum of thicknesses of the filling layer and the first spacer layer is greater than the sum of thicknesses of the drain and the channel layer, to make the second conductive layer and the pixel electrode be located at different levels.

8 Claims, 3 Drawing Sheets

ARRAY SUBSTRATE, DISPLAY DEVICE AND METHOD FOR FABRICATING ARRAY SUBSTRATE

CROSS REFERENCE TO RELATED APPLICATION

This application claims the priority of Chinese Patent Application No. 201410855413.8 entitled "Array Substrate, Display Device and Method for Fabricating Array Substrate", filed on Dec. 31, 2014, the disclosure of which is incorporated herein by reference in its entirety.

BACKGROUND OF THE INVENTION

1. Field of the Invention

The invention relates to the field of display technology, and particularly to an array substrate and a display device.

2. Description of Related Art

A liquid crystal display (LCD) is a commonly used electronic device, and because of its low power consumption, small size, light weight and other characteristics, it is quite popular for users. In a thin film transistor liquid crystal display (TFT-LCD) employing a vertical alignment technology, a pixel generally is demarcated/divided into a main area and a sub area, and a pixel voltage applied onto the sub area is lower than a pixel voltage applied onto the main area so as to improve the large viewing angle color shift. Under general circumstances, an array substrate disposed with a thin film transistor of main area and a thin film transistor of sub area is disposed with a pull-down capacitor. The pull-down capacitor is cooperative with the thin film transistor of the sub area to share a part of charges on the thin film transistor of the sub area, so as to make the pixel voltage of the sub area to be decreased to an appropriate proportion. The pull-down capacitor adopts a MII structure, and a structure of the pull-down capacitor with the MII structure generally includes a metal layer, a first insulating layer (e.g., G-SiNx), a second insulating layer (PA-SiNx) and a transparent conductive layer. Thus it can be seen that, the topmost layer of the pull-down capacitor with the MII structure generally is the transparent conductive layer, such as indium tin oxides (ITO). The topmost layer of the thin film transistor of the sub area also is a transparent conductive layer (may be a pixel electrode), the transparent conductive layer as the topmost layer of the thin film transistor of the sub area and the transparent conductive layer as the topmost layer of the pull-down capacitor with the MII structure are located on a same layer, and the two transparent conductive layers have a small gap therebetween. In a fabricating process of the array substrate, such as etching or developing process, it is easy to produce residual transparent conductive layer, resulting in short circuit occurred between the transparent conductive layer as the topmost layer of the thin film transistor of the sub area (Sub TFT) and the transparent conductive layer as the topmost layer of the pull-down capacitor with the MII structure, the pull-down capacitor could not normally pull down the pixel voltage of the sub area, the pixel would produce a small bright spot and display quality of the display device is affected consequently. Please refer to FIG. 1 and FIG. 2, FIG. 1 is a schematic view showing short circuit occurred between a transparent conductive layer as the topmost layer of a thin film transistor of sub area and a transparent conductive layer as the topmost layer of a pull-down capacitor in the prior art, and FIG. 2 is a schematic view showing a small bright spot produced/displayed on a display device in the prior art. As illustrated in FIG. 1 and FIG. 2, the produced small bright spot caused by the short circuit occurred between the transparent conductive layer as the topmost layer of the thin film transistor of sub area and the transparent conductive layer as the topmost layer of the pull-down capacitor is denoted by SP, and the pull-down capacitor is represented by C.

SUMMARY OF THE INVENTION

The invention provides an array substrate, and the array substrate can achieve high display quality.

Specifically, the array substrate includes: a substrate, and a thin film transistor and a pull-down capacitor disposed on a same surface of the substrate. The pull-down capacitor is disposed neighboring with the thin film transistor. The thin film transistor includes: a gate, a gate insulating layer and a channel layer successively stacked on the surface of the substrate; a source and a drain, the source and the drain being disposed on the channel layer, the source and the drain being disposed spaced from each other; a passivation layer stacked on the source, the drain and the channel layer, the passivation layer being disposed with a via hole, the via hole being disposed corresponding to the drain, a pixel electrode being connected to the drain through the via hole. The pull-down capacitor includes: a first conductive layer, a first spacer layer, a filling layer, a second spacer layer and a second conductive layer successively stacked on the surface of the substrate. A sum of a thickness of the filling layer and a thickness of first spacer layer is greater than a sum of thicknesses of the drain and the channel layer, so as to make the second conducive layer and the pixel electrode to be located at different planes.

In an embodiment, the thickness of the filling layer is greater than a thickness of the source, and the thickness of the filling layer is greater than the thickness of the drain.

In an embodiment, the sum of the thickness of the filling layer and the thickness of the first spacer layer is greater with 0.3 μm~0.6 μm than the sum of the thicknesses of the drain and the channel layer, so that the second conductive layer is higher with 0.3 μm~0.6 μm than the pixel electrode.

In an embodiment, a material of the filling layer is a metal or an alloy.

In another aspect, the invention provides a display device. The display device includes the array substrate according to any one of the above described embodiments.

In still another aspect, the invention provides a method for fabricating an array substrate. The method for fabricating an array substrate includes: providing a substrate; disposing a first metal layer on a surface of the substrate and patterning the first metal layer to form a gate and a first conductive layer, the gate and the first conductive layer being disposed spaced from each other; forming a gate insulating layer on the gate; disposing a first semiconductor layer and patterning the first semiconductor layer to form a channel layer disposed on the gate insulating layer and a first spacer layer disposed on the first conductive layer; disposing a second metal layer and patterning the second metal layer to form a source and a drain disposed at two sides of the channel layer and a filling layer disposed on the first spacer layer, wherein a sum of thicknesses of the filling layer and the first spacer layer is greater than a sum of thicknesses of the drain and the channel layer; disposing an insulating layer, defining the insulating layer disposed on the source, the drain and the channel layer as a passivation layer and defining the insulating layer disposed on the filling layer as a second spacer layer; forming a second conductive layer on the second spacer layer, wherein the gate, the gate insulating layer, the channel layer, the source and the drain together define a thin film transistor, the first conductive layer, the first spacer layer, the filling layer, the second spacer layer and the second conductive layer together define a pull-down capacitor; forming a via hole corresponding to the drain in the passivation layer and disposing a pixel electrode corresponding to the via hole on the passivation layer.

In an embodiment, the filling layer, the source and the drain are formed in a same manufacturing process step.

In an embodiment, the first conductive layer and the gate are formed in a same manufacturing process step, the first spacer layer and the channel layer are formed in a same manufacturing process step.

In an embodiment, the second spacer layer and the passivation layer are formed in a same manufacturing process step.

In an embodiment, the thickness of the filling layer is greater than a thickness of the source, and the thickness of the filling layer is greater than the thickness of the drain.

In the array substrate and the display device of the invention, by adding the filling layer in the pull-down capacitor, the second conductive layer of the pull-down capacitor and the pixel electrode are arranged at different planes/levels, a distance between the second conductive layer and the pixel electrode are increased, and therefore the second conductive layer and the pixel electrode are not easy to be short-circuited, the display quality of the display device is improved consequently.

BRIEF DESCRIPTION OF THE DRAWINGS

In order to more clearly illustrate the technical solution of an embodiment of the invention, drawings will be used in the description of embodiments will be given a brief description below. Apparently, the drawings in the following description only are some of embodiments of the invention, the ordinary skill in the art can obtain other drawings according to these illustrated drawings without creative effort.

DETAILED DESCRIPTION OF THE PREFERRED EMBODIMENTS

In the following, with reference to accompanying drawings of embodiments of the invention, technical solutions in the embodiments of the invention will be clearly and completely described. Apparently, the embodiments of the invention described below only are a part of embodiments of the invention, but not all embodiments. Based on the described embodiments of the invention, all other embodiments obtained by ordinary skill in the art without creative effort belong to the scope of protection of the invention.

Figure 1:
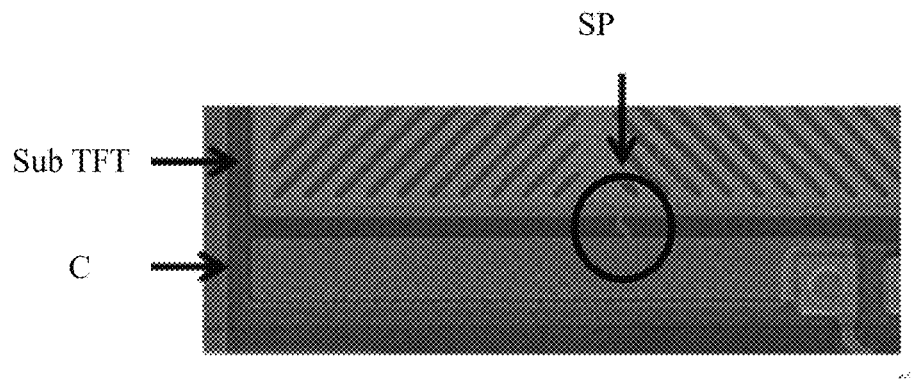
FIG. 1 is a schematic view showing short circuit occurred between a transparent conductive layer as the topmost layer of a thin film transistor of a sub area and a transparent conductive layer as the topmost layer of a pull-down capacitor in the prior art.
Figure 2:
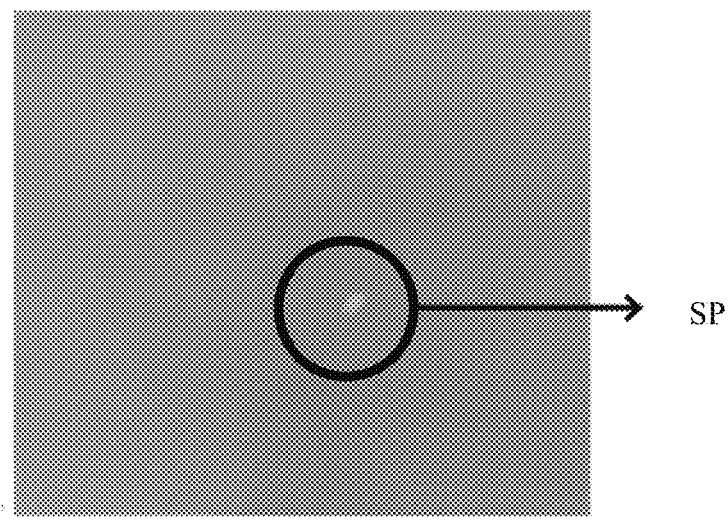
FIG. 2 is a schematic view showing a small bright spot produced on a display device in the prior art.
Figure 3:
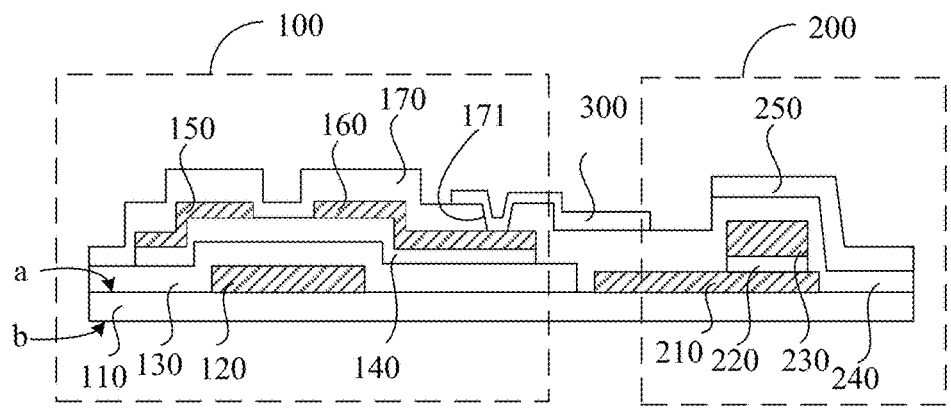
FIG. 3 is a schematic structural cross-sectional view of an array substrate according to a preferred embodiment of the invention.

Please refer to FIG. 3, FIG. 3 is a schematic structural cross-sectional view of an array substrate according to a preferred embodiment of the invention. In particular, the array substrate 10 includes a substrate 110, and a thin film transistor 100 and a pull-down capacitor 200 disposed on a same side of the substrate 110. The thin film transistor 100 may be a thin film transistor corresponding to a sub pixel area, and the pull-down capacitor 200 is disposed neighboring with the thin film transistor 100. The thin film transistor 100 includes a gate 120, a gate insulating layer 130 and a channel layer 140 successively stacked on a surface of the substrate 100. The thin film transistor 100 further includes a source 150, a drain 160 and a passivation layer 170. The source 150 and the drain 160 are disposed on the channel layer 140, and the source 150 and the drain 160 are disposed spaced from each other. The passivation layer 170 is stacked on the source 150, the drain 160 and the channel layer 140. The passivation layer 170 is disposed with a via hole 171, the via hole 171 is disposed corresponding to the drain 160, and a pixel electrode 300 is connected to the drain 160 through the via hole 171. The pull-down capacitor 200 includes a first conductive layer 210, a first spacer layer 220, a filling layer 230, a second spacer layer 240 and a second conductive layer 250. The second conductive layer 250 and the pixel electrode 300 are located at different planes. In other words, the second conductive layer 250 and the pixel electrode 300 are not located at a same plane/level.

The substrate 110 includes oppositely disposed first surface a and second surface b, In this embodiment, the thin film transistor 100 and the pull-down capacitor 200 are disposed on the first surface a of the substrate 110. In other embodiment, the thin film transistor 100 and the pull-down capacitor 200 are disposed on the second surface b of the substrate 110 instead. The substrate 110 is a transparent substrate, and in this embodiment, the substrate 110 is a glass substrate. It should be understood that, in other embodiment, the substrate may be a plastic substrate.

In an embodiment, the array substrate 100 further includes a buffer layer (not shown), the buffer layer is disposed on the substrate 110, and in this situation, the thin film transistor 100 and the pull-down capacitor 200 are disposed on the surface of the substrate 100 through the buffer layer. The buffer layer is used for buffering the encountered stress during fabricating the thin film transistor 100 and the pull-down capacitor 200 on the substrate 110, so as to avoid the substrate 100 being damage or cracked. A material of the buffer layer is one selected from the group consisting of silicon oxide layer, silicon nitride layer, Silicon oxynitride layer and combinations thereof.

The gate 120 is disposed at a middle portion of the first surface a of the substrate 110. A material of the gate 120 is a metal or an alloy. For example, the material of the gate 120 is one selected from the group consisting of copper, tungsten, chromium, aluminum and combinations thereof.

The gate insulating layer 130 is disposed overlying the gate 120 and a portion of the first surface a of the substrate 110 uncovered by the gate 120. A material of the gate insulating layer 130 may be one of silicon oxide layer, silicon nitride layer, Silicon oxynitride layer and combinations thereof.

The channel layer 140 is disposed on the gate insulating layer 130. The channel layer 140 is used for generating a current under the control of the gate 120 or not generating the current under the control of the gate 120. When the thin film transistor 100 is turned on, the channel layer 140 acts as a channel in the thin film transistor which the current flow through.

The source 150 and the drain 160 are disposed on the channel layer 140, and the source 150 and the drain 160 are disposed spaced from each other. When the gate 120 of the thin film transistor 100 control the channel layer 140 to have a current flow therethrough, the source 150 and the drain 160 are electrically communicated with each other, the thin film transistor 100 is in turned-on state; when the gate 120 of the thin film transistor 100 controls the channel layer 140 to have no current flow therethrough, the source 150 and the drain 160 are cut off, the thin film transistor 100 is in turned-off state.

The passivation layer 170 is disposed overlying the source 150, the drain 160 and the portion of the channel layer 140 uncovered by the source 150 and the drain 160. The passivation layer 170 is disposed with a via hole 171, and the via hole 171 is disposed corresponding to the drain 160. The pixel electrode 300 is connected to the drain 160 through the via hole 171. A material of the pixel electrode 300 is a transparent conductive material. The pixel electrode 300 includes one of Indium tin oxide, indium zinc oxide, indium oxide, zinc oxide and so on, or is any combination thereof.

The pull-down capacitor 200 includes the first conductive layer 210, the first spacer layer 220, the filling layer 230, the second spacer layer 240 and the second conductive layer 250 successively stacked on the surface of the substrate.

The first conductive layer 210 of the pull-down capacitor 200 is disposed at the middle portion of the first surface of the substrate 110. The first conductive layer 210 and the gate 120 are disposed spaced from each other and located at a same plane/level. A material of the first conductive layer 210 is a metal or an alloy. For example, the material of the first conductive layer 210 is one selected from the group consisting of copper, tungsten, chromium, aluminum and combinations thereof. Preferably, the first conductive layer 210 of the pull-down capacitor 200 and the gate 120 of the thin film transistor 100 are formed in a same manufacturing process step, i.e., are generally simultaneously formed, so as to reduce preparation step of the array substrate. The first conductive layer 210 and the gate 120 can be formed by the following method that: a layer of metal firstly is formed on the first surface a of the substrate 110, and for the convenience of description, the layer of metal herein is called as first metal layer, the first metal layer then is patterned to form the spacedly disposed gate 120 and first conductive layer 210.

The first spacer layer 220 of the pull-down capacitor 200 and the channel layer 140 are formed in a same manufacturing process step, so as to save fabrication step of the array substrate 10. A material of the first spacer layer 220 and the channel layer 140 may be amorphous silicon (α-Si).

The filling layer 230 of the pull-down capacitor 200 and the source 150 and the drain 160 are formed in a same manufacturing process step, so as to save fabrication step of the array substrate 10. In this embodiment, a material of the filling layer 230 is same as a material of the source 150 and the drain 160. The material of the filling layer 230, the source 150 and the drain 160 may be one selected from the group consisting of copper, tungsten, chromium, aluminum and combinations thereof. A fabrication process of the filling layer 230, the source 150 and the drain 160 is as follows: a layer of metal firstly is formed on the channel layer 140 and the first spacer layer 220, and for the convenience of description, the layer of metal herein is called as second metal layer; the second metal layer then is patterned to form the spacedly disposed source 150 and drain 160 on the channel layer 140 as well as the filling layer 230 on the first spacer layer 220.

The second spacer layer 240 of the pull-down capacitor 200 and the passivation layer 170 are formed in a same manufacturing process step, so as to save fabrication step of the array substrate. The second conductive layer 250 and the pixel electrode 300 also are formed in a same manufacturing process step, so as to save fabrication step of the array substrate. In this embodiment, the second conductive layer 250 is higher with 0.3 μm~0.6 μm than the pixel electrode 300. The height difference is enough to make the second conductive layer 250 and the pixel electrode 300 to be located at different panels, i.e., located at different levels, so as to effectively reduce the probability of short circuit occurred between the second conductive layer 250 and the pixel electrode 300.

In the array substrate 10 of the invention, by adding the filling layer 230 in the pull-down capacitor 200, the second conductive layer 250 of the pull-down capacitor 200 and the pixel electrode 300 are arranged at different levels/planes, a distance between the second conductive layer 250 and the pixel electrode 300 is increased, and therefore the second conductive layer 250 and the pixel electrode 300 are not easy to be short-circuited, the display quality associated with the array substrate 10 can be improved.

Figure 4:
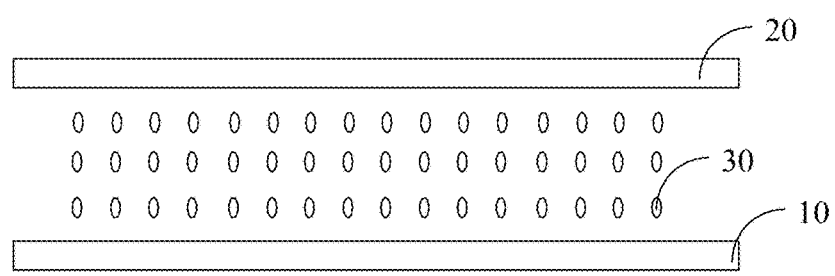
FIG. 4 is a schematic structural cross-sectional view of a display device according to a preferred embodiment of the invention.

A display device of the invention will be described below in conjunct on with FIG. 3. Please refer to FIG. 4, FIG. 4 is a schematic structural cross-sectional view of a display device according to a preferred embodiment of the invention. In particular, the display device 1 includes the array substrate and a color filter substrate 20. The array substrate 10 and the color filter substrate 20 are oppositely disposed. The concrete structure of the array substrate 10 is illustrated in FIG. 3. In this embodiment, the display device 1 is a liquid crystal display. The display device 1 further includes a liquid crystal layer 30 disposed between the array substrate 10 and the color filter substrate 20.

The array substrate 10 includes the substrate 110, and the thin film transistor 100 and the pull-down capacitor 200 disposed on the same surface of the substrate 110. The pull-down capacitor 200 is disposed neighboring with the thin film transistor 100. The thin film transistor 100 includes the gate 120, the gate insulating layer 130 and the channel layer 140 successively stacked on the surface of the substrate 100. The thin film transistor 100 further includes the source 150, the drain 160 and the passivation layer 170. The source 150 and the drain 160 are disposed on the channel layer 140, and the source 150 and the drain 160 are disposed spaced from each other. The passivation layer 170 is stacked on the source 150, the drain 160 and the channel layer 170. The passivation layer 170 is disposed with the via hole 171, the via hole 171 is disposed corresponding to the drain 160, and the pixel electrode 300 is connected to the drain 160 through the via hole 171. The pull-down capacitor 200 includes the first conductive layer 210, the first spacer layer 220, the filling layer 230, the second spacer layer 240 and the second conductive layer 250. The second conductive layer 250 and the pixel electrode 300 are located at different planes, i.e., generally different levels. In other words, the second conductive layer 250 and the pixel electrode 300 are not located at a same plane/level. The detailed structure of the array substrate 10 is described in the paragraphs above, and would not be explained again here.

The substrate 110 includes oppositely disposed first surface a and second surface b. In this embodiment, the thin film transistor 100 and the pull-down capacitor 200 are disposed on the first surface a of the substrate 110. In other embodiment, the thin film transistor 100 and the pull-down capacitor 200 are disposed on the second surface b of the substrate 110 instead. The The first conductive layer 210 of the pull-down capacitor 200 is disposed at the middle portion of the first surface of the substrate 110. The first conductive layer 210 and the gate 120 are disposed spaced from each other. A material of the first conductive layer 210 is a metal or an alloy. For example, the material of the first conductive layer 210 is one selected from the group consisting of copper, tungsten, chromium, aluminum and combinations thereof. Preferably, the first conductive layer 210 of the pull-down capacitor 200 and the gate 120 of the thin film transistor 100 are formed in a same manufacturing process step, i.e., are generally simultaneously formed, so as to reduce preparation/fabrication step of the array substrate. The first conductive layer 210 and the gate 120 can be formed by the following method that: a layer of metal firstly is formed on the first surface a of the substrate 110, and for the convenience of description, the layer of metal herein is called as first metal layer, the first metal layer then is patterned to form the spacedly disposed gate 120 and first conductive layer 210.

In the array substrate 10 of the display device 1 of the invention, by adding the filling layer 230 in the pull-down capacitor 200, the second conductive layer 250 of the pull-down capacitor 200 and the pixel electrode 300 are not arranged at a same level/plane, a distance between the second conductive layer 250 and the pixel electrode 300 is increased, and therefore the second conductive layer 250 and the pixel electrode 300 are not easy to be short-circuited, the display quality of the display device 1 can be improved.

Figure 5:
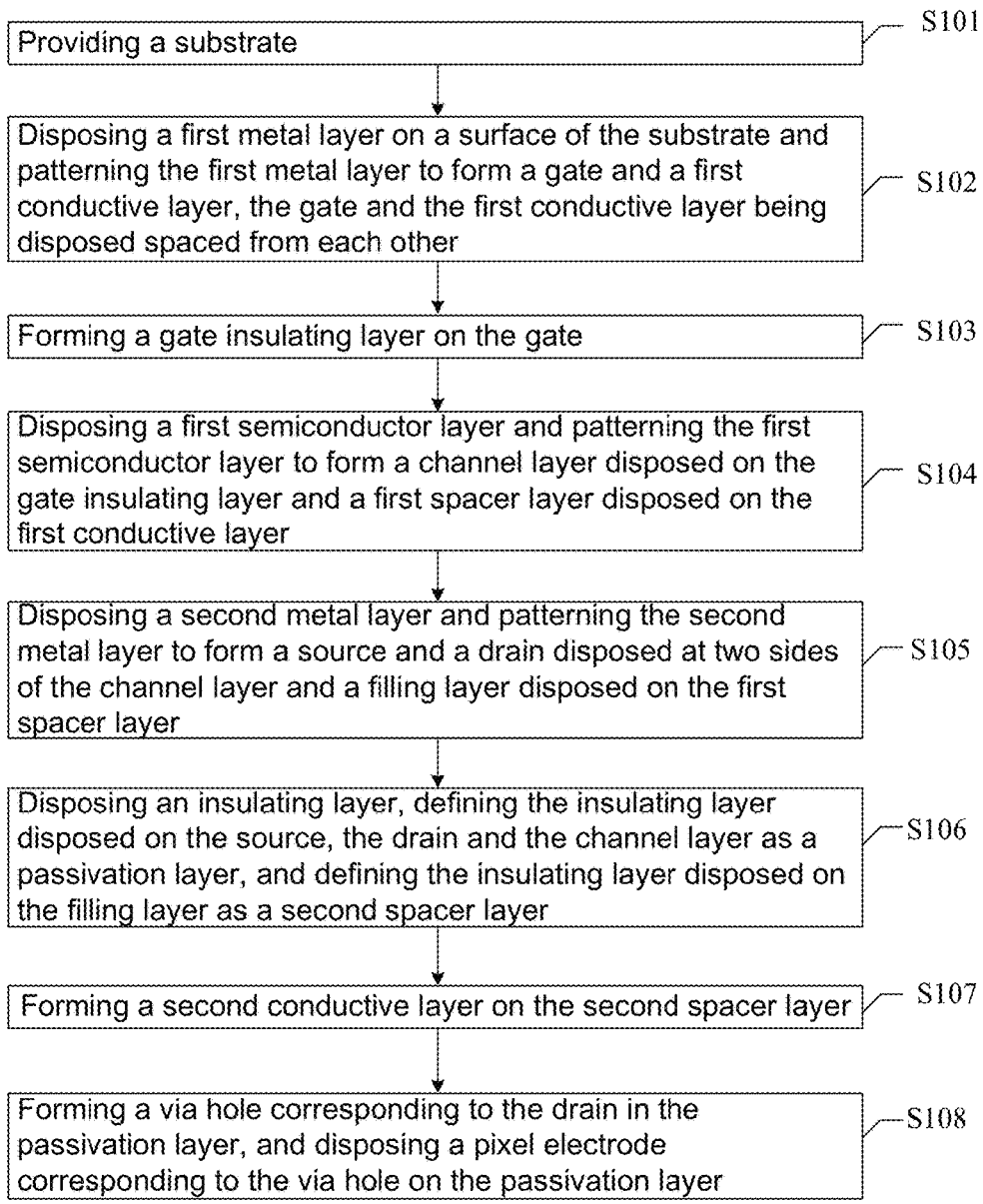
FIG. 5 is a flowchart of a method for fabricating an array substrate according to a preferred embodiment of the invention.

A method for fabricating an array substrate of the invention will be described below in conjunction with FIG. 3. Please refer to FIG. 5, FIG. 5 is a flowchart of a method for fabricating an array substrate according to a preferred embodiment of the invention. The method for fabricating an array substrate includes but is not limited to the following steps.

Step S101: providing a substrate 101. The substrate 101 includes opposite first surface a and second surface b.

Step S102: disposing a first metal layer on a surface of the substrate 110 and patterning the first metal layer to form a gate 120 and a first conductive layer 210, the gate 120 and the first conductive layer 210 being disposed spaced from each other.

Step S103: forming a gate insulating layer 130 on the gate 120.

Step S104: disposing a first semiconductor layer and patterning the first semiconductor layer to form a channel layer 140 disposed on the gate insulating layer 130 and a first spacer layer 220 disposed on the first conductive layer 210.

Step S105: disposing a second metal layer and patterning the second metal layer to form a source 150 and a drain 106 respectively disposed at two sides of the channel layer 140 and a filling layer 230 disposed on the first spacer layer 220. The sum of thicknesses of the filling layer 230 and the first spacer layer 220 is greater than the sum of thicknesses of the drain 160 and the channel layer 140.

Step S106: disposing an insulating layer, defining the insulating layer disposed on the source 150, the drain 160 and the channel layer 140 as a passivation layer 170, and defining the insulating layer disposed on the filling layer 230 as a second spacer layer 240.

Step S107: forming a second conductive layer 250 on the second spacer layer 240. The gate 120, the gate insulating layer 130, the channel layer 140, the source 150 and the drain 160 together define a thin film transistor 100. The first conductive layer 210, the first spacer layer 220, the filling layer 230, the second spacer layer 240 and the second conductive layer 250 together define a pull-down capacitor 200. The thin film transistor 100 and the pull-down capacitor 200 are disposed spaced from each other.

Step S108: forming a via hole 171 corresponding to the drain 160 in the passivation layer 170 and disposing a pixel electrode 300 corresponding to the via hole 171 on the passivation layer 170.

Preferably, the filling layer 230, the source 150 and the drain 160 are formed in a same manufacturing process step, so as to save fabrication step.

Preferably, the first conductive layer 210 and the gate 120 are formed in a same manufacturing process step, so as to save fabrication step.

Preferably, the first spacer layer 220 and the channel layer 140 are formed in a same manufacturing process step, so as to save fabrication step.

Preferably, the second spacer layer 240 and the passivation layer 170 are formed in a same manufacturing process step, so as to save fabrication step.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:
1. An array substrate comprising:
a substrate, and a thin film transistor and a pull-down capacitor disposed on a same surface of the substrate, the pull-down capacitor being disposed neighboring with the thin film transistor;
the thin film transistor comprising:
a gate, a gate insulating layer and a channel layer successively stacked on the surface of the substrate;
a source and a drain, the source and the drain being disposed on the channel layer, the source and the drain being disposed spaced from each other; and
a passivation layer stacked on the source, the drain and the channel layer, the passivation layer being disposed with a via hole, the via hole being disposed corresponding to the drain, a pixel electrode being connected to the drain through the via hole;
the pull-down capacitor comprising:
a first conductive layer, a first spacer layer, a filling layer, a second spacer layer and a second conductive layer successively stacked on the surface of the substrate; a sum of a thickness of the filling layer and a thickness of the first spacer layer is greater than a sum of thicknesses of the drain and the channel layer, so as to make the second conducive layer and the pixel electrode to be located at different planes,
wherein the sum of the thickness of the filling layer and the thickness of the first spacer layer is greater by 0.3 μm-0.6 μm than the sum of the thicknesses of the drain and the channel layer.
2. The array substrate as claimed in claim 1, wherein the thickness of the filling layer is greater than a thickness of the source, and the thickness of the filling layer is greater than the thickness of the drain.

3. The array substrate as claimed in claim 2, wherein the second conductive layer is higher by 0.3 μm-0.6 μm than the pixel electrode.

4. The array substrate as claimed in claim 1, wherein a material of the filling layer is a metal or an alloy.

5. A display device comprising an array substrate, the array substrate comprising:
   a substrate, and a thin film transistor and a pull-down capacitor disposed on a same surface of the substrate, the pull-down capacitor being disposed neighboring with the thin film transistor;
   the thin film transistor comprising:
      a gate, a gate insulating layer and a channel layer successively stacked on the surface of the substrate;
      a source and a drain, the source and the drain being disposed on the channel layer, the source and the drain being disposed spaced from each other; and
      a passivation layer stacked on the source, the drain and the channel layer, the passivation layer being disposed with a via hole therein, the via hole being disposed corresponding to the drain, a pixel electrode being connected to the drain through the via hole;
   the pull-down capacitor comprising:
      a first conductive layer, a first spacer layer, a filling layer, a second spacer layer and a second conductive layer successively stacked on the surface of the substrate; a sum of a thickness of the filling layer and a thickness of the first spacer layer is greater than a sum of thicknesses of the drain and the channel layer, so as to make the second conducive layer and the pixel electrode to be located at different levels,
      wherein the sum of the thickness of the filling layer and the thickness of the first spacer layer is greater by 0.3 μm-0.6 μm than the sum of the thicknesses of the drain and the channel layer.

6. The display device as claimed in claim 5, wherein the thickness of the filling layer is greater than a thickness of the source, and the thickness of the filling layer is greater than the thickness of the drain.

7. The array substrate as claimed in claim 6, wherein the second conductive layer is higher by 0.3 μm-0.6 μm than the pixel electrode.

8. The display device as claimed in claim 5, wherein a material of the filling layer is a metal or an alloy.

* * * * *